United States Patent
Shieh et al.

(10) Patent No.: US 7,224,295 B2
(45) Date of Patent: May 29, 2007

(54) SYSTEM AND METHOD FOR MODULATION AND DEMODULATION USING CODE SUBSET CONVERSION

(75) Inventors: Jia-Horng Shieh, Taipei County (TW); Pi-Hai Liu, Taipei (TW)

(73) Assignee: Mediatek Inc., Hsin-Chu Hsien (TW)

( * ) Notice: Subject to any disclaimer, the term of this patent is extended or adjusted under 35 U.S.C. 154(b) by 0 days.

(21) Appl. No.: 11/277,351

(22) Filed: Mar. 23, 2006

(65) Prior Publication Data
US 2007/0008194 A1  Jan. 11, 2007

Related U.S. Application Data
(60) Provisional application No. 60/595,489, filed on Jul. 11, 2005.

(51) Int. Cl.
*H03M 5/00* (2006.01)
(52) U.S. Cl. .............. 341/58; 341/59; 341/50; 341/51
(58) Field of Classification Search ............ 341/58, 341/59, 144, 143, 50, 51; 704/219; 708/400; 375/240; 369/59.24
See application file for complete search history.

(56) References Cited

U.S. PATENT DOCUMENTS

| | | | | |
|---|---|---|---|---|
| 5,347,479 A | * | 9/1994 | Miyazaki | 708/400 |
| 5,684,482 A | * | 11/1997 | Galton | 341/144 |
| 6,002,718 A | * | 12/1999 | Roth | 375/240 |
| 6,188,335 B1 | * | 2/2001 | Roth et al. | 341/59 |
| 6,195,778 B1 | | 2/2001 | Tran | |
| 6,728,669 B1 | * | 4/2004 | Benno | 704/219 |
| 2002/0159367 A1 | * | 10/2002 | Ahn | 369/59.24 |

\* cited by examiner

*Primary Examiner*—Jean Bruner Jeanglaude
(74) *Attorney, Agent, or Firm*—Winston Hsu

(57) ABSTRACT

The present invention provides a method and system for converting an input code into an output code. The method includes: determining a plurality of input code subsets of the input code; converting the input code subsets into a plurality of output code subsets, respectively; and merging the output code subsets to generate the output code. The system includes a splitter, for determining a plurality of input code subsets of the input code; a mapper, coupled to the splitter, for converting the input code subsets into a plurality of output code subsets, respectively; and a merger, coupled to the mapper, for merging the output code subsets to generate the output code.

46 Claims, 12 Drawing Sheets

Fig. 1 Related Art

| Data word | State 0 | | State 1 | | State 2 | |
|---|---|---|---|---|---|---|
| | Code word | Next state | Code word | Next state | Code word | Next state |
| 00 | 100010 00000* | 0 | 010100 01000* | 0 | 010100 010000 | 0 |
| 01 | 100010 00000# | 1 | 010100 010001 | 1 | 010100 010001 | 1 |
| 02 | 100010 000010 | 0 | 010100 010010 | 0 | 010100 010010 | 0 |
| 03 | 100010 000010 | 1 | 010100 010010 | 1 | 010100 010010 | 1 |
| 04 | 100010 10000* | 0 | 010100 01010* | 0 | 010100 010100 | 0 |
| 05 | 100010 10000# | 1 | 010100 010101 | 1 | 010100 010101 | 1 |
| ⋮ | ⋮ | ⋮ | ⋮ | ⋮ | ⋮ | ⋮ |
| 1D | 100010 000101 | 1 | 010000 000101 | 1 | 010000 000100 | 0 |
| ⋮ | ⋮ | ⋮ | ⋮ | ⋮ | ⋮ | ⋮ |
| 2D | 100000 100101 | 1 | 010100 100101 | 1 | 010100 100101 | 1 |
| 2E | 100000 100100 | 2 | 010100 100100 | 2 | 010100 100100 | 2 |
| 2F | 100000 101000 | 2 | 010100 101000 | 2 | 010100 101000 | 2 |
| 30 | 10000* 01000* | 0 | 010101 01000* | 0 | 010101 010000 | 0 |
| 31 | 10000# 010001 | 1 | 010101 010001 | 1 | 010101 010001 | 1 |

Fig. 2 Related Art

| Current code word | Data word | | |
|---|---|---|---|
| | Case 1 | Case 2 | Case 3 |
| 000000 000100 | FC | FE | FE |
| 000000 000101 | Z | FC | FD |
| 000000 001000 | 48 | 4F | 4F |
| 000000 001001 | Z | 48 | F9 |
| 000000 001010 | FA | FA | FB |
| 000000 010000 | F0 | F7 | FZ |
| ....... | ....... | ....... | ....... |
| 000010 000000 | C0 | Z | C1 |
| ....... | ....... | ....... | ....... |
| 000010 100001 | Z | C4 | C5 |
| 000010 100010 | C6 | C6 | C7 |
| 000010 100100 | CC | CE | CE |
| 000010 100101 | Z | CC | CD |
| 000010 101000 | C8 | CF | CF |

# SYSTEM AND METHOD FOR MODULATION AND DEMODULATION USING CODE SUBSET CONVERSION

CROSS REFERENCE TO RELATED APPLICATIONS

This application claims the benefit of U.S. Provisional Application No. 60/595,489, filed on Jul. 11, 2005, entitled "System and Method for Modulation and Demodulation Bit Sub-Set Conversion," and incorporated herein by reference.

BACKGROUND

The high-density digital-versatile disc (HD-DVD) uses an eight to twelve modulation (ETM) technique. That is, 8-bit symbols (i.e., user bytes or data words) are converted into 12-bit code words that are stored on the disc.

Figure 1:
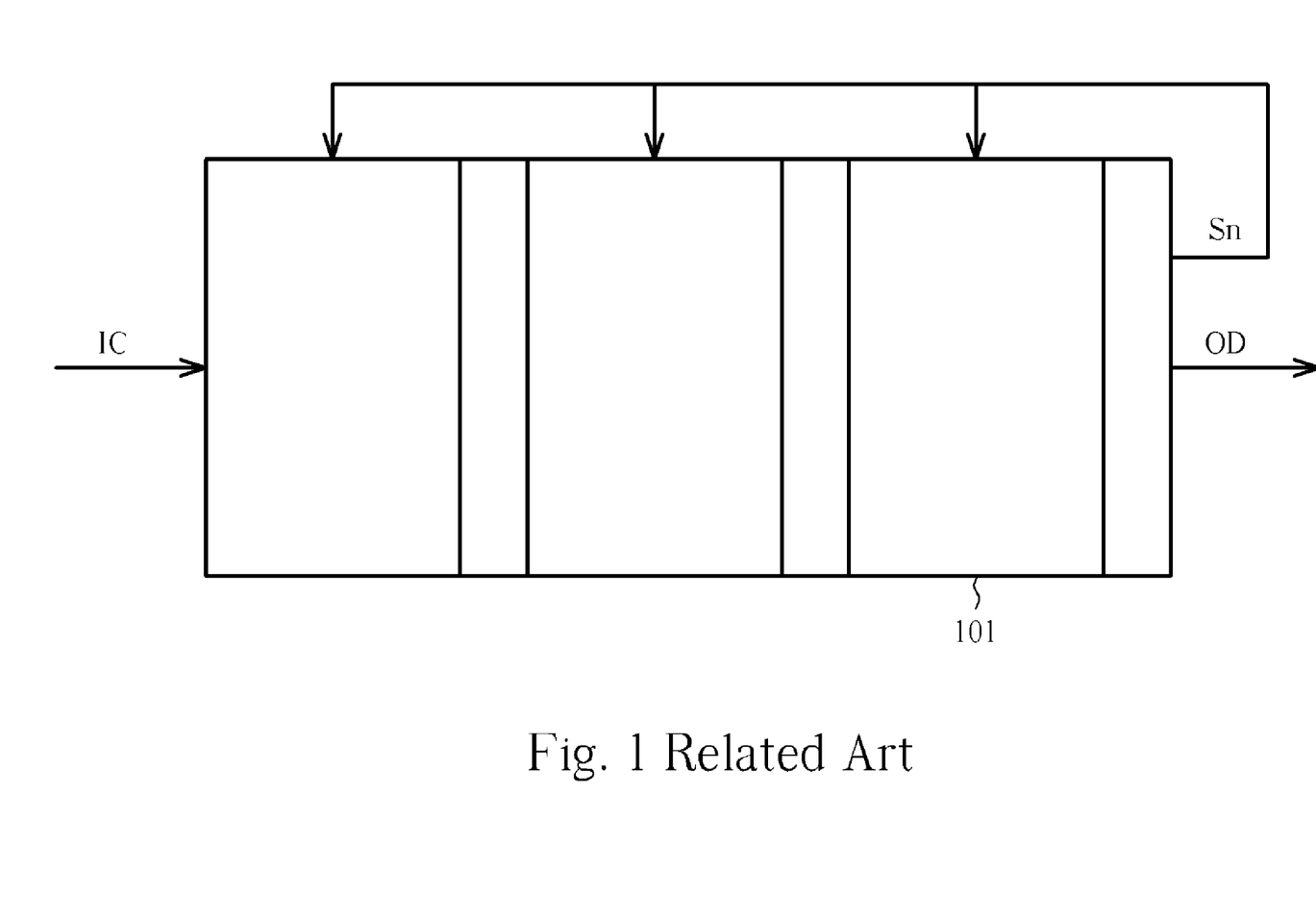
FIG. 1 is a schematic diagram illustrating a related art method for modulation/demodulation.

FIG. 1 is a schematic diagram illustrating a related art modulating and demodulating method. As shown in FIG. 1, an input code IC (for example, a data word) is converted into an output code OD (for example, a code word) according to a table 101. A factor $S_n$ called state or case is also determined according to the input code IC, the output code OD, and the table 101. For HD-DVD modulation, input code IC represents an 8-bit data word, output code represents a 12-bit code word, and table 101 is a preset modulation table; however, for HD-DVD demodulation, input code IC represents a 12-bit code word, output code represents an 8-bit data word, and table 101 is a preset demodulation table.

Figure 2:
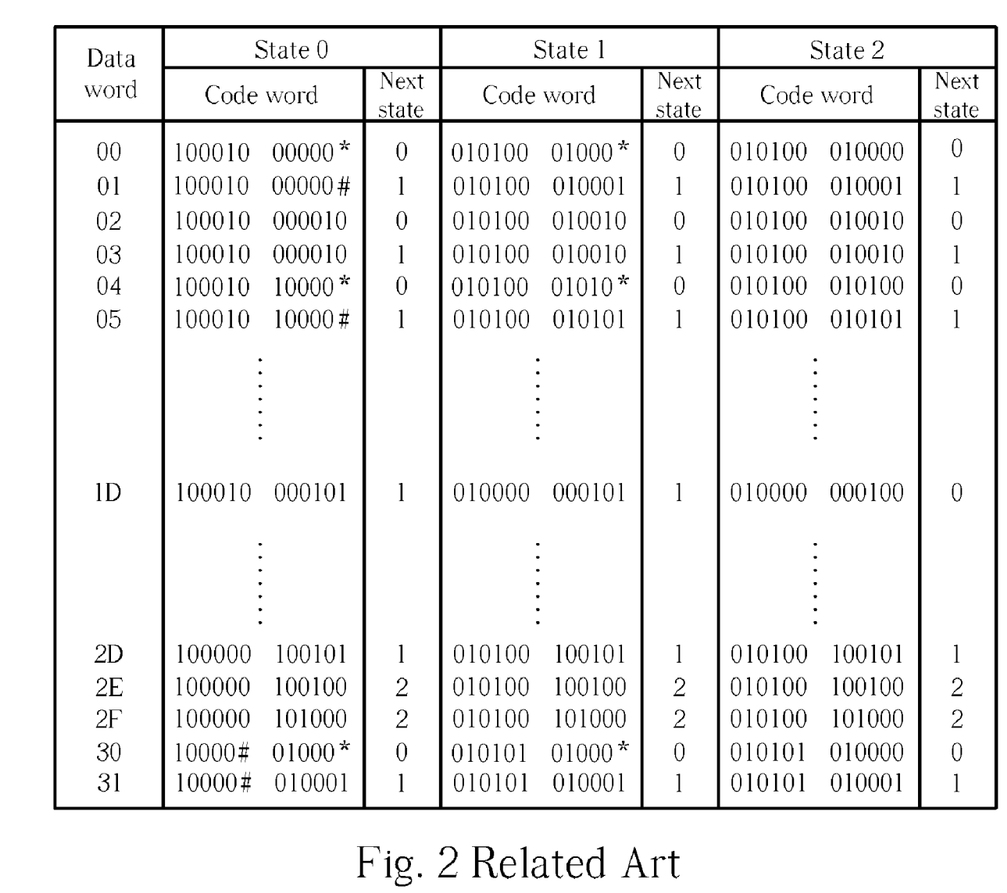
FIG. 2 illustrates a portion of a related art modulation table.

Taking HD-DVD encoding for example, this modulation table requires 256 (8-bit)×3 (12-bit) entries. FIG. 2 illustrates a portion of a related art modulation table. As shown in FIG. 2, if a data word needs to be transformed to a code word, the location of the data word in the modulation table must first be confirmed, and then the code word corresponding to the data word is determined in view of the state value. Taking data word 1D (hex) for example, if the state is 0, then the codeword is 100010 000101(binary); if the state is 1, the codeword is 010000 000101(binary); and if the state is 2, the codeword is 010000 000101(binary).

The bit asterisk "*" in the code conversion table FIG. 2 shows that the bit is a merging-bit. Some code words of the conversion table have merging-bit in their LSB. The merging-bit is set to 0(binary) or 1(binary) by code connector according to channel bit following itself. If the following channel bit is 0b, the merging-bit shall be set to 1b. If the following channel bit is 1b, the merging-bit shall be set to 0b.

The bit sharp "#" in the conversion table FIG. 2 shows that the bit is a DSV (Digital Sum Values) control bit. The DSV control bit is determined by executing DC component suppression control by DSV controller. The purpose is to minimize the absolute value of the accumulated DSV.

Figure 3:
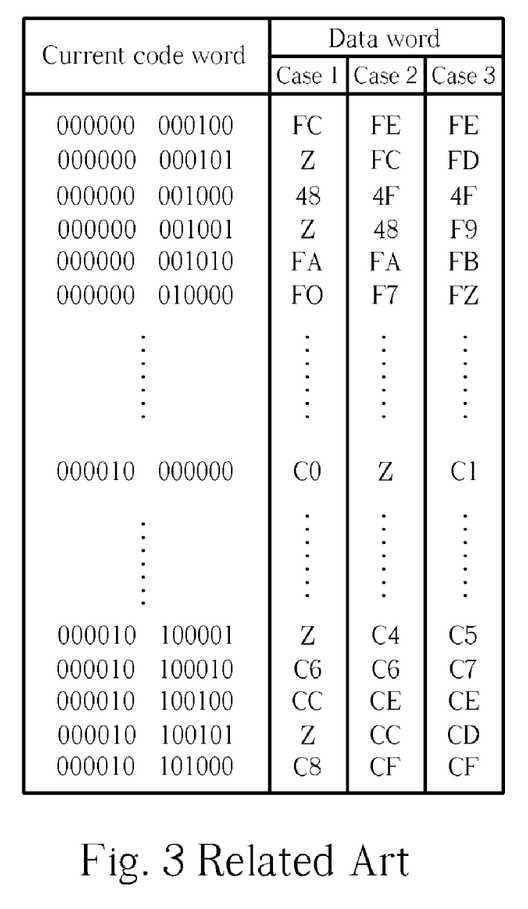
FIG. 3 illustrates a portion of a related art demodulation table.

For HD-DVD decoding, the demodulation table requires 355 (12-bit)×3 (8-bit) entries. FIG. 3 illustrates a portion of a related art demodulation table. As shown in FIG. 3, if a code word needs to be transformed to a data word. The location of the code word must first be confirmed, and then the data word corresponding to the code word is determined in view of the case value. Taking code word 000010 000000 for example, if the case is 1, then the data word is C0; if the case is 2, then the data word is E; if the case is 3, then the data word is C1.

However, the modulation table shown in FIG. 2 and the demodulation table shown in FIG. 3 are not complete. The actual modulation table and demodulation table dimensions are many times greater than that shown in the modulation table in FIG. 2 and the demodulation table in FIG. 3. Thus, the modulation and demodulation tables are difficult to implement and consume a large space because of a high channel bit rate. Therefore, a system or method for solving this problem is needed.

SUMMARY

One of the objectives of this disclosure is therefore to provide a method and apparatus for simplifying the modulation table and the demodulation table.

According to the claimed disclosure, a method for converting an input code into an output code includes: determining a plurality of input code subsets of the input code; converting the input code subsets into a plurality of output code subsets, respectively; and merging the output code subsets to generate the output code. Also, the step of converting the input code subsets may modulate the input code subsets into the output code subsets, or demodulates the input code subsets into the output code subsets.

According to the claimed disclosure, a system for converting an input code into an output code includes: a splitter, for determining a plurality of input code subsets of the input code; a mapper, coupled to the splitter, for converting the input code subsets into a plurality of output code subsets, respectively; and a merger, coupled to the mapper, for merging the output code subsets to generate the output code.

The mapper modulates the input code subsets into the output code subsets or demodulates the input code subsets into the output code subsets.

These and other objectives of the present disclosure will no doubt become obvious to those of ordinary skill in the art after reading the following detailed description of the preferred embodiment that is illustrated in the various figures and drawings.

DETAILED DESCRIPTION

Figure 4:
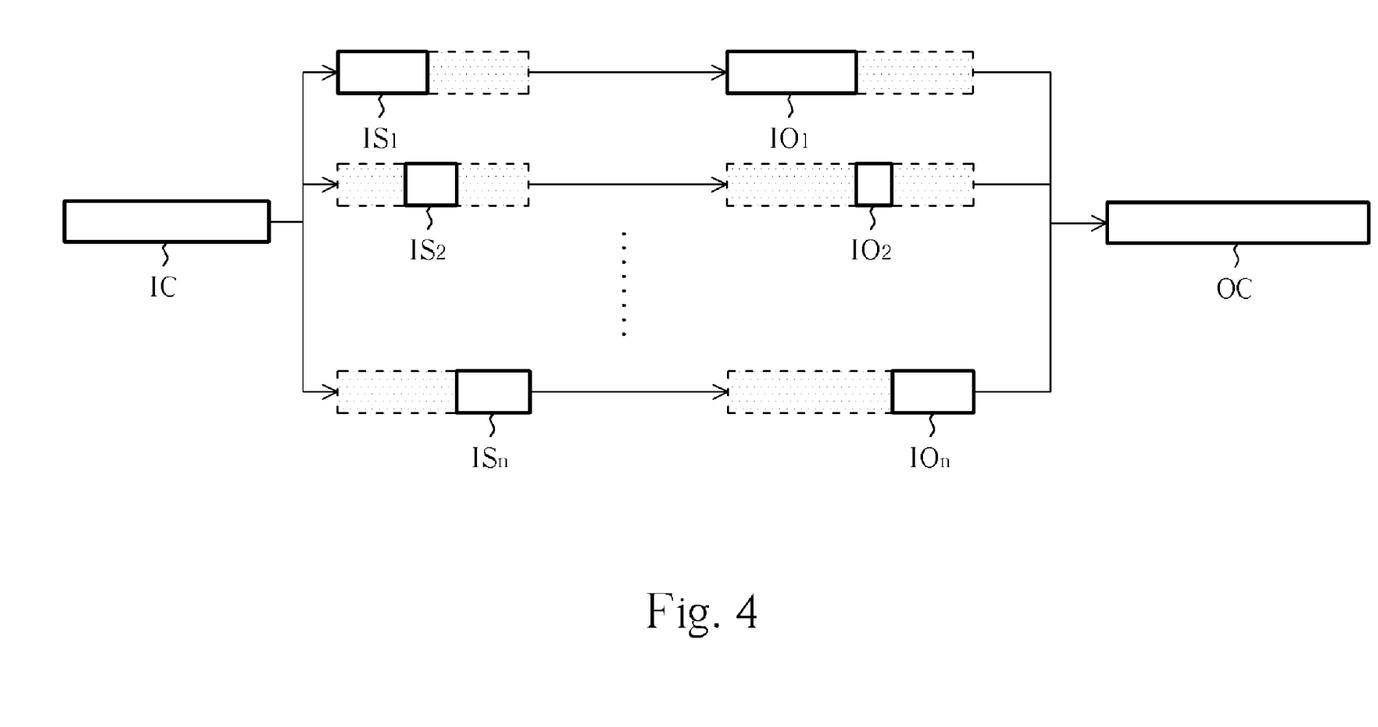
FIG. 4 illustrates a schematic diagram of a method for modulation/demodulation according to a preferred embodiment of this disclosure.

FIG. 4 is a schematic diagram illustrating the preferred embodiment of this disclosure. As shown in FIG. 4, the input code IC is defined to include a plurality of input code subsets, and then the input code subsets $IS_1$-$IS_n$ are converted into a plurality of output code subsets $IO_1$-$IO_n$, respectively. After that, the output code subsets are merged to generate the desired output code OC corresponding to the input code IC.

Figure 5A:
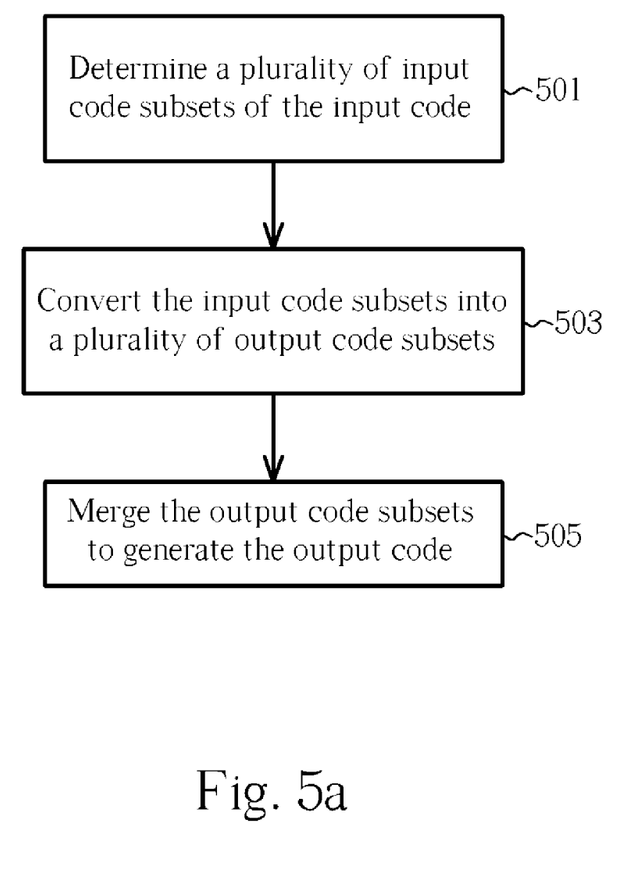
FIG. 5 illustrates a flow chart of a method for modulation/demodulation according to the preferred embodiment of this disclosure.

In other words, the method for modulating and demodulating according to the preferred embodiment of this disclosure may be shown according to FIG. 5(a). In FIG. 5(a), step 501 determines a plurality of input code subsets of the input code. Next, step 503 converts the input code subsets into a plurality of output code subsets, respectively. After that, step 505 merges the output code subsets to generate the output code to complete the modulation or demodulation of the input code.

Figure 5B:
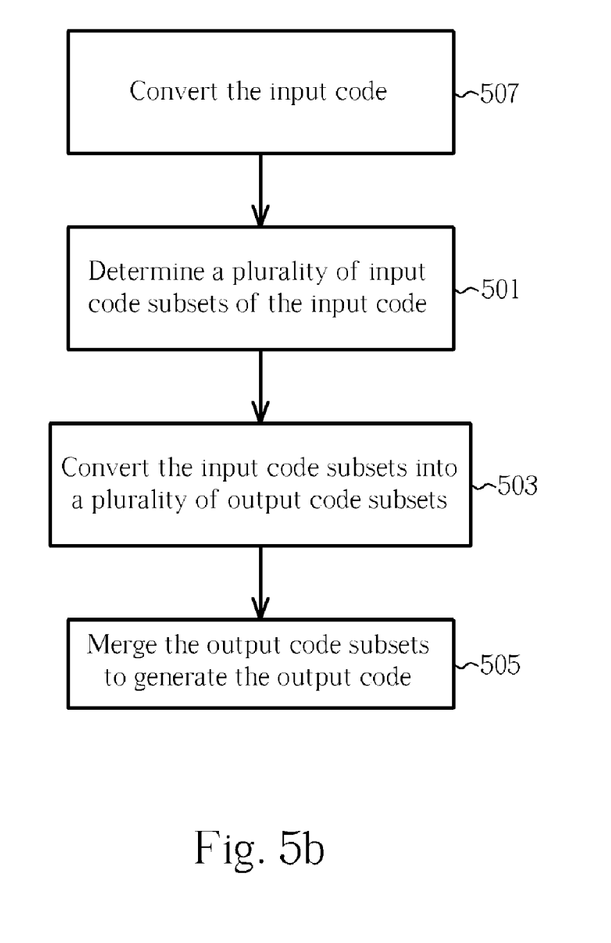

FIG. 5(b) is another embodiment of FIG. 5(a), comparing with FIG. 5(a), FIG. 5(b) further includes a step 507 for converting the raw data into input codes. For example, performing an "OR" operation of the raw data and 00010000 to generate an input data. It should be noted that, according to the present invention, the input code subsets can be converted from the raw data or input data partially or fully. For example, one part of the input subsets are generated from the raw data, the other part of the input subsets are generated from the input data converted from the raw data, and the two parts of the input data are merged.

Also, in FIG. 5(a) and FIG. 5(b), the step 505 can further include a step for applying a logic calculation on the output code, subtracting 1 from the output data, for example.

Figure 6:
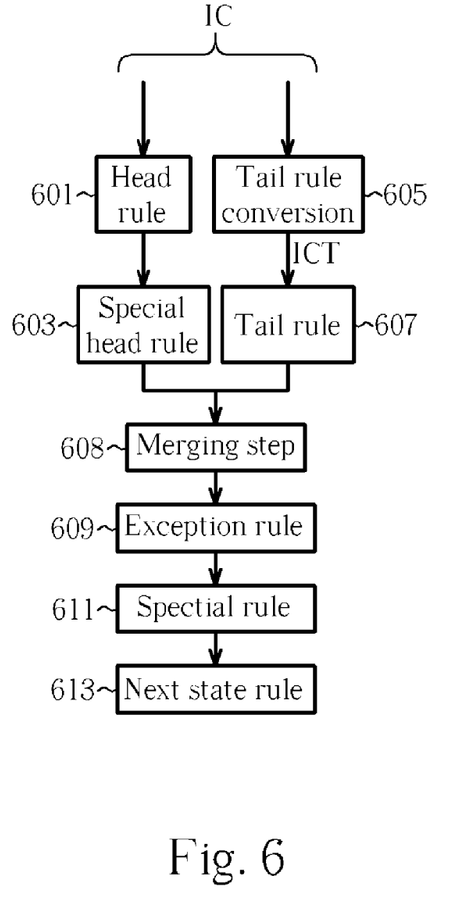
FIG. 6 is a flow chart illustrating detailed steps for modulating an input code.

FIG. 6 is a flow chart illustrating detailed steps for modulating an input code IC. Step 601 and step 603 are used to modulate a leading input code subset LIS to a leading output subset. Step 601 modulates the leading input code subset LIS into the leading output code subset using a head rule. To comply with the above-mentioned related art modulation table, step 603 is implemented to adjust the leading output code subset generated from step 601 when a special head rule is satisfied. Also, correspondingly, step 605 and step 607 cooperate to modulate an ending input code subset EIS to an ending output code subset. To make the output of the following step 607 generate a correct result, step 605 is implemented to modulate the input code IC into an updated input code ICT when a specific rule (i.e., a tail rule conversion) is satisfied. In other words, if the tail rule conversion is not performed, the updated input code ICT is identical to the original input code IC; otherwise, the updated input code ICT is different from the original input code IC. That is, step 607 modulates the original ending input code subset into an ending output code subset when the specific rule is not met, and modulates the updated ending input code subset into the ending output code subset when the specific rule is met. As shown in FIG. 6, step 608 merges the leading output code subset from steps 601 through 603 and the ending output code subset from steps 605 through 607.

When steps 601, 603, 605, and 607 fail to generate the output code sub sets, then step 609 directly modulates the input code into the output code using an exception rule. Additionally, step 611 is executed to reference a special rule to add a control bit (#) or a merging bit (*) to the output code according to at least one of the input code subsets and the output code subsets, wherein the control bit is utilized for controlling a DC value, and the merging bit is utilized for controlling merging of two output codes. Then, step 613 determines the next state according to at least one of an output code subset and an input code subset.

However, assuming that the same result is obtained, it should be noted that the order of steps 601 through 613 is not limited to that shown in FIG. 6.

That is, the value of the output code depends on the input code, and the same output code is generated while the input code being converted utilizing steps 601 through 613, regardless of the order in which the steps 701 through 709 are performed.

In this embodiment, step 601 follows the rules as shown below:

```
IC [0000----]=>CS0 [100010------] CS1,2 [010100------]
IC [0001----]=>CS0 [100010------] CS1,2 [010000------]
IC [0010----]=>CS0 [100000------] CS1,2 [010100------]
IC [0011----]=>CS0 [100000------] CS1,2 [010101------]
IC [010X----]=>CS0 [101010------] CS1,2 [010010------]
IC [0110----]=>CS0 [101000------] CS1,2 [010000------]
IC [0111----]=>CS0 [101001------] CS1,2 [010001------]
IC [1000----]=>CS0 [100100------] CS1,2 [000100------]
IC [1001----]=>CS0 [101000------] CS1,2 [001000------]
IC [1010----]=>CS0 [101000------] CS1,2 [000100------]
IC [1011----]=>CS0 [100101------] CS1,2 [000101------]
IC [110x----]=>CS0 [000010------] CS1,2 [001010------]
IC [1110----]=>CS0 [000000------] CS1,2 [001000------]
IC [1111----]=>CS0 [000001------] CS1,2 [001001------]
```

In these rules, IC means input code, and CSx means the state to which the input code corresponds. For instance, CS0 represents a state equal to 0, CS1 represents a state equal to 1, and CS2 represents a state equal to 2. Therefore, the same leading input code subset is converted to different leading output code subset according to different states. For example, if the first four bits in binary format of the leading input code subset are "1111" and the state is 0, then the first six bits in binary format of the leading output code are "000001". However, if the state is 0, the first six bits of the leading output code sub set are "001001."

Step 603 follows the rule shown below:

```
IC [--1000--]=>CS0,1,2 [-----1------]
```

Step 605 follows the rule shown below:

```
If IC=[1000----] or
    {(State=1 or State=2) and IC is [0000----]}
    then ICT= IC with the 4th MSB bit replaced with 1
else
    ICT=IC
```

Step 607 follows the rules shown below:

```
ICT [---000--]=>CS0,1,2 [------ 00----]
ICT [---001--]=>CS0,1,2 [------ 10----]
ICT [---10---]=>CS0,1,2 [------ 01----]
ICT [----000x]=>CS0,1,2 [------ --0001]
ICT [----001x]=>CS0,1,2 [------ --0010]
ICT [---0010x]=>CS0,1,2 [------ --0000]
ICT [---1010x]=>CS0,1,2 [------ --0101]
ICT [---0011x]=>CS0,1,2 [------ --0010]
ICT [---10110]=>CS0,1,2 [------ --0100]
ICT [---10111]=>CS0,1,2 [------ --0000]
```

```
ICT [---01---]=>CS0,1,2 [------ 10----]
ICT [---11---]=>CS0,1,2 [------ 00----]
ICT [----100x]=>CS0,1,2 [------ -1001]
ICT [----101x]=>CS0,1,2 [------ -1010]
ICT [----110x]=>CS0,1,2 [------ --0101]
ICT [----1110]=>CS0,1,2 [------ --0100]
ICT [----1111]=>CS0,1,2 [------ --1000]
```

Step 609 in this embodiment is applied to data words of values in hex format 34-35, 48, 49, 4A-4B, 4F, 75, CA, F5, and follows the rules shown below:

```
34~35: IC [0011010x]
=>CS0 [100000 010101] CS1,2 [010000 000001]
48: IC [01001000]
=>CS0 [000000 001001] CS1,2 [010010 101001]
49: IC [01001001]
=>CS0 [100000 000001] CS1,2 [010010 101001]
4A~4B: IC [0100101x]
=>CS0 [100000 000010] CS1,2 [010010 101010]
4F: IC [01001111]
=>CS0 [000000 001000] CS1,2 [010010 101000]
75: IC [01110101]
=>CS0 [101001 010101] CS1,2 [010001 000000]
CA: IC [11001010]
=>CS0 [000010 101010] CS1,2 [001000 000010]
F5: IC [11110101]
=>CS0 [000000 010101] CS1,2 [001001 010101]
```

Step 611 is used to determine the merging-bit 'i' and the DC control bit "#" following the rules shown below. It should be noted that, the following examples are used for determining the merging-bit "*" and the DC control bit "#" utilizing the input subsets, but it doesn't mean to limit the scope of the present invention. For example, the merging-bit "*" and the DC control bit "#" can also be determined according to the output code subsets or the mixing of the input code subsets and the output code subsets.

```
IC [------00] => CS0, 1 ,2 [------ -----*]
IC [---00-01] =>CS0[------ -----#], where if IC= [10000001]
then CS0=[100100010001] or if IC =[10000101], then
CS0=[100100010101]
IC [100-10--]=>CS0 [------ --#---]
IC [(0011----or 1111----) and (----0101)] =>CS0 [-----# ------],
where if IC= [11111000], then CS0=[00000100100*] or if IC=
[11111111], then CS0=[000001001000]
IC [(---00-01) and (-00-----)]=>CS1, 2 [------ -----#], where if
IC= [01100001,61], then CS1=[010001000001]
IC [(-00010--) or (-00110-and 0-----0-)]=> CS1, 2 [------ --
#---], where if IC= [10011010,9A], then CS1=[001000001010]
IC [11------]=>CS2 [--#--- ------]
However, if IC [11001010,CA], then CS2=[001000000010]
and if IC [11110101,F5], then CS2=[001001010101]
```

Step 613 follows the rules shown below to determine the next state. It should be noted that though the next state is determined according to the output code subsets in the following rules, but it doesn't mean to limit the scope of the present invention. The next state can also be determined according to the input code subsets or the mixing of the input code subsets and the output code subsets.

```
CS0, 1, 2 [------ -----*]=>Next State=0
CS0, 1, 2 [------ -----#]=>Next State=1
CS0, 1, 2 [------ ------1]=>Next State=1
CS0, 1, 2 [------ -00000]=>Next State=1
CS0, 1, 2 [------ ----00] and IC [------ -000001]=> Next
state=2
CS0, 1, 2 [------ ----10] and IC [-------0]=> Next state=0
CS0, 1, 2 [------ ----10] and IC [-------1]=> Next state=1
```

It should be noted that the input code and the output code comply with HD-DVD specification in this embodiment. That is, input code is an 8-bit code, output code is a 12-bit code, and the output code satisfies the bit string rule. The bit string rule dictates that the number of bits with logic value "0" positioned between two bits having a logic value "1" is limited to an amount from one to ten. Also, the input code itself may be converted from a raw data before the steps shown in FIG. 6 are performed. Besides, according to the aforementioned rules, it is apparent that the output code corresponding to the first state is derived from the value of the output code corresponding to the second state.

Utilizing steps 601 through 613, a simplified modulation table utilized for converting an 8-bit data word to a 12-bit code word is formed, thus the dimensions and complexity of the modulation table are decreased.

Besides, according to another embodiment, the steps 601, 603, 605, 607, 609 and 611 follows the different rules from the rules described above.

The step 601 and 603 follows the rules described below, wherein the value of the input code IC indicates the first four bits of the input code IC in hex format and the value of the output code OC indicates the first six bits of the output code OC in binary format:

```
State 0
IC [E] or IC [F]->OC [000000] IC [F]->OC [000001]
IC [C] or IC [D]->OC [000010] IC [2] or IC [3]->OC[100000]
IC [3]->OC [100001]      IC [0] or IC [1]->OC[100010]
IC [8] or IC [A]->OC [100100]    IC [B]->OC [100101]
IC [6] or IC [9]->OC [101000]    IC [7]->OC [101001]
IC [4] or IC [5]->OC [101010]
State 1, State 2
IC [8] or IC [A]->OC [000100]
IC [B]->OC [000101]
IC [9] or IC [E]->OC [001000]
IC [F]->OC [001001]
IC [C] or IC [D]->OC [001010]
IC [1] or IC [6]->OC [010000]
IC [7]->OC [010001]
IC [4] or IC [5]->OC [010010]
IC [0] or IC [2]->OC [010100]
IC [3]->OC [010101]
```

Additionally, the step 605 and the step 607 follow the steps described as below, wherein the value of IC indicates the final four bits of a 8-bit code:

```
State=0 and the first four bits of IC=0,2,4~6,A,C,E in hex format
State=1 or 2 and the first four bits of IC =2,4,6,A,C,E in hex format
IC [*]->OC [000000]
IC [0] or IC [1]->OC [000001]
IC [2] or IC [3]->OC [000010]
IC [*]->OC [100000]
IC [4] or IC [5]->OC [100001]
IC [6] or IC [7]->OC [100010]
```

-continued

```
IC [E]->OC [100100]
IC [C] or IC [D]->OC [100101]
IC [F]->OC [101000]
IC [8] or IC [9]->OC [101001]
IC [A] or IC [B]->OC [101010]
State=0 and the first four bits of IC=1,3,5,7,8,9,B,D,F in hex format
State=1 or 2 and the first four bits of IC=0,1,3,5,7,8,9,B,D,F in hex
format
IC [E]->OC [000100]
IC [C] or IC [D]->OC [000101]
IC [F]->OC [001000]
IC [8] or IC [9]->OC [001001]
IC [A] or IC [B]->OC [001010]
IC [7]->OC [010000]
IC [0] or IC [1]->OC [010001]
IC [2] or IC [3]->OC [010010]
IC [6]->OC [010100]
IC [4] or IC [5]->OC [010101]
```

Furthermore, step 609 follows the rules described as below:

```
State=0 or 1 or 2
If the first four bits in hex format of IC=[2] or [6] or [A] or [E] and the
final four bits in hex format of IC=[0] or [1], then OC=[xxxxx1,
000010] in binary format
If the first four bits in hex format of IC=[2] or [6] or [A] or [E] and the
final four bits in hex format of IC=[2] or [3], then OC=[xxxxx1,
000010] in binary format
State=1 or 2
If the first four bits in hex format of IC=[3] and the final four bits in
hex format of IC=[4], IC=[5], then OC=[010000,000001] in binary
format
If the first four bits in hex format of IC=[7] and the final four bits in
hex format of IC=[5], then OC=[010001,000000] in binary format
If the first four bits in hex format of IC=[C] and the final four bits in
hex format of IC=[A], then OC=[001000,000010] in binary format
State=0
If the first four bits in hex format of IC=[4] and the final four bits in
hex format of IC=[8], then OC=[000000,00100*] in binary format
If the first four bits in hex format of IC=[4] and the final four bits in
hex format of IC=[9], then OC=[100000,000001] in binary format
If the first four bits in hex format of IC=[4] and the final four bits in
hex format of IC=[A], then OC=[100000,000010] in binary format
If the first four bits in hex format of IC=[4] and the final four bits in
hex format of IC=[B], then OC=[100000,000010] in binary format
If the first four bits in hex format of IC=[4] and the final four bits in
hex format of IC=[F], then OC=[000000,001000] in binary format
If the first four bits in hex format of IC=[3] and the final four bits in
hex format of IC=[5], then OC=[100000,010101] in binary format
```

Additionally, the step 611 follows the rules described as below:

```
If the final two bits of IC=[00], then the final bit of OC=*
State=0
If the final four bits in hex format of IC =[1] or =[5], then the
final bit of output code is #.
If the first four bits in hex format of IC=[8] or [9] and the final
four bits of IC=[8] or [9] or [0] or [A] or [B], then the ninth bit of the
output code is #
If the first four bits in hex format of IC=[3] (but IC=[35] is not
included),
or [F] (but IC=[F5],[F8],[FF] are not included), than the sixth bit of OC
is #
State=1 or State=2
If the final four bits in hex format of IC =[1] or =[5], then the
final bit of output code is #. (but IC=[61] is not included)
If the first four bits in hex format of IC=[0] or [1] or [8] or [9] and
the final four bits of IC=[8] or [9] or [0] or [A] or [B], then the ninth bit
of the output code is # (but IC=[18], [19], [9A] are not included)
```

```
State=2
If the value of first four bits in hex format of IC=[C] or [D] or [E]
or [F], then the third bit of the output code is # (but IC=[CA] and
IC=[F5] are not included)
```

Figure 7:
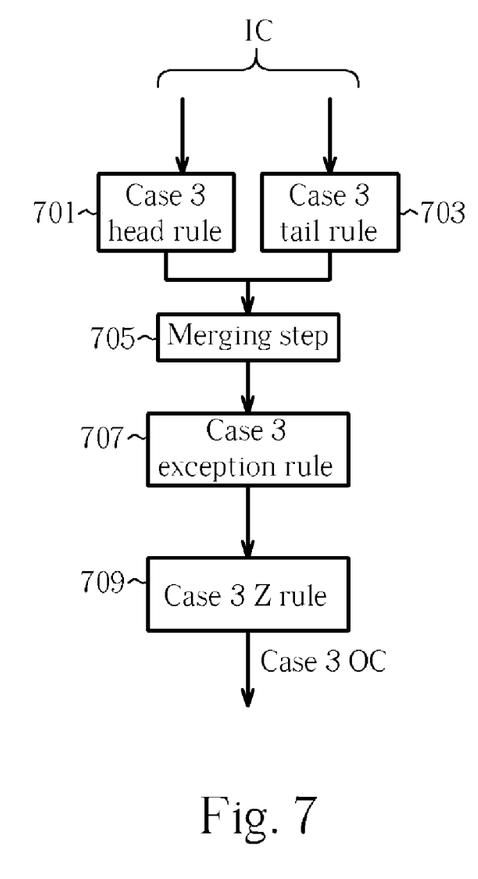
FIG. 7 is a flow chart illustrating detailed steps for demodulating an input code.

FIG. 7 is a flow chart illustrating detailed steps for demodulating an input code IC to generate an output code corresponding to a third case. The method shown in FIG. 7 utilizes a code word as the input code and demodulates this input code to generate an output code, i.e., a data word. Step 701 demodulates a leading input code subset to a leading output code subset corresponding to the third case by referencing a case 3 head rule, and step 703 converts an ending input code subset to an ending output code subset corresponding to the third case by referencing a case 3 tail rule. Then, step 705 merges the leading output code subset from step 701 and the ending output code subset from step 703 to generate an output code. Similar to the above-mentioned modulation process, it is possible that there is a demodulation exception. In the case of an exception, step 707 directly converts the input code that step 701 and step 703 fail to convert into the output code corresponding to the third case by referencing a case 3 exception rule.

Also, step 709 determines if the input code has an error, that is, if the input code meets a case 3 Z rule, the output code corresponding to the third case is assigned by a symbol Z indicating demodulation error and doesn't care value.

Utilizing steps 701 through 709, the input code is converted to an output code corresponding to the third case (i.e., the case 3 OC shown in FIG. 7). However, it should be noted that, assuming the same result is obtained, the order of steps 701 through 709 is not limited to that shown in FIG. 7. That is, the value of the output code depends on the input code, and the same output code is generated while the input code being converted utilizing steps 701 through 709 regardless of the order of the steps.

In this embodiment, step 701 follows the rules shown below: The input is in binary format and the output is in hex format

```
IC=[010100 0-----] or [100010 1-----] or [100010 0000-] =>
case 3 OC =[0-]
  IC=[010100 1-----] or [010101 0000--] or [100000 1-----] or
[100001 0000--] => case 3 OC =[2-]
  IC=[010010 1-----] or [010010 0000--] or [101010 1-----] or
[101010 0000--] or [100000 0000--] => case 3 OC =[4-]
  IC=[101000 1-----] or [101001 0000--] or [010001 0000--] or
[010000 1-----] => case 3 OC =[6-]
  IC=[010000 0-----] or [100010 0-----] =>case 3 OC=[1-]
  IC=[010101 0-----] or [10000- 0-----] =>case 3 OC=[3-]
  IC=[010010 0-----] or [101010 0-----] =>case 3 OC=[5-]
  IC=[010001 0-----] or [101001 0-----] =>case 3 OC=[7-]
  IC=[-00100 0-----] =>case 3 OC=[8-]
  IC=[-01000 0-----] =>case 3 OC=[9-]
  IC=[-00101 0-----] =>case 3 OC=[B-]
  IC=[00-010 0-----] =>case 3 OC=[D-]
  IC=[00000- 0-----] or [001001 0-----] =>case 3 OC=[F-]
```

Also, step 703 follows the rules shown below:

```
IC=[------ -10101] or [------10000-] or [----00 000000]
OR [----00 000000] =>case 3 OC=[-5]
IC=[------ -10000] or ]------ 100010] =>case 3 OC=[-7]
```

-continued

```
IC=[------ --1001] or [----00 000001] =>case 3OC=[-9]
IC=[------ --1010] or [----00 000010] =>case 3OC=[-B]
IC=[------ --0001] or [----10 000000] or [----01 000000] =>case
3 OC=[-1]
IC=[------ --0010] =>case 3 OC=[-3]
IC=[------ -10100] =>case 3 OC=[-6]
IC=[------ -00101] =>case 3 OC=[-D]
IC=[------ -00100] =>case 3 OC=[-E]
IC=[------ --1000] =>case 3 OC=[-F]
```

```
IC=[000000 001000]=> case 3 OC=[4F]
IC=[000100 000000]=> case 3 OC=[B5]
IC=[001000 000000]=> case 3 OC=[F5]
IC=[010000 000001]=> case 3 OC=[35]
IC=[010001 000000]=> case 3 OC=[75]
IC=[100100 000000]=> case 3 OC=[B5]
IC=[101000 000000]=> case 3 OC=[75]
```

Furthermore, step 709 follows the rule shown below:

```
If IC=[01xx00 000000] or [xx0001 010101]=>case 3 OC=[Z]
```

It should be noted that in the above case 3 Z rule, x could be "0" or "1".

Figure 8:
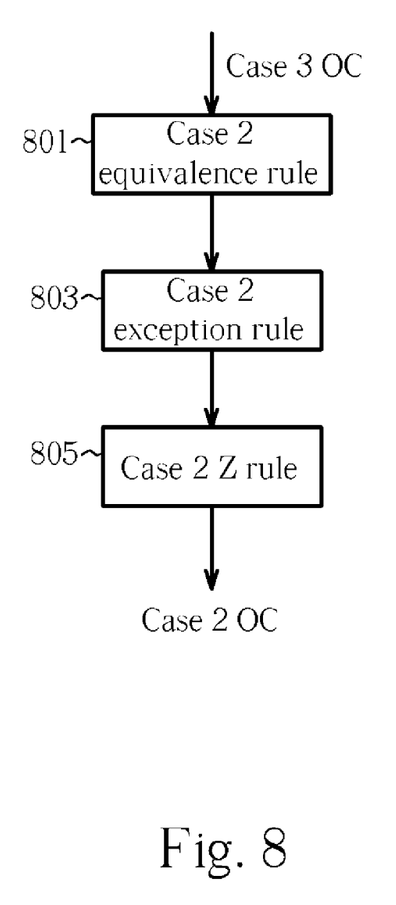
FIG. 8 is a flow chart illustrating detailed steps for demodulating an output code corresponding to a third case to generate an output code corresponding to a second case.

FIG. 8 is a flow chart illustrating detail steps for demodulating the output code corresponding to the third case to generate an output code corresponding to a second case. According to this embodiment, demodulation output code of one case can be generated from demodulation output code from another case. For example, in this embodiment the demodulation output code of the second case can be generated from demodulation output code of the third case. However, it doesn't mean to limit the scope of the present invention. The demodulation output code of the second case can be generated from the input code subset directly.

Step 801 demodulates the input code (i.e., the output code corresponding to the third case) if the input code meets a case 2 equivalence rule. Step 803 directly demodulates the input code that step 801 failed to demodulate to generate an output code by referencing a case 2 exception rule. Step 805 determines if the input code has an error, that is, if the input code meets a case 2 Z rule, the output code corresponding to the second case is assigned by a symbol Z indicating demodulation error and doesn't care value. Assuming the same result is obtained, it should be noted that the order in which steps 801 through 805 is not limited to that shown in FIG. 8.

In this embodiment, the step 801 follows the rules shown below:

```
If IC=[------ ----00] then
   Case2 OC=Case 3 OC
else
   Case2 OC =Case 3 OC − 1
```

Step 803 follows the rules shown below:

```
IC=[000000 001001]=> Case2 OC=[48]
IC=[001000 000010]=>Case2 OC=[CA]
```

Step 805 follows the rules shown below:

```
IC=[------ -00000]=>Case 2[Z]
IC=[001010 101010]=>Case 2[Z]
IC=[100000 000001]=>Case 2[Z]
```

Figure 9:
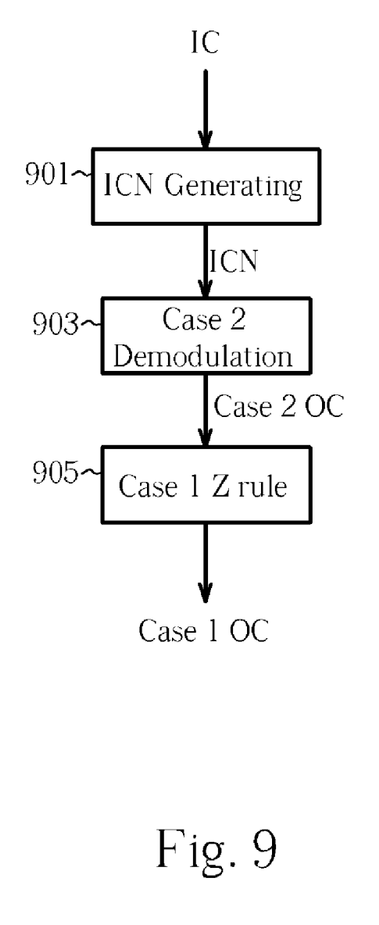
FIG. 9 is a flow chart illustrating detailed steps for demodulating an input code to generate an output code corresponding to a first case.

FIG. 9 is a flow chart illustrating detailed steps for demodulating the input code to generate an output code corresponding to a first case. Also, FIG. 9 illustrates that the input data is converted from the raw data first and then the input subsets are generated from the input data. Moreover, the output code of the first case can generated from the input code subsets, the output codes of the second case or the third case, or generated from the mixing of the output codes of the second case or the third case. As shown in FIG. 9, step 901 demodulates the input code IC to generate an input code N (ICN). Step 903 performs a case 2 modulation utilizing the input code N as an input code to generate an output code corresponding to the second case (i.e., Case 2 OC). After that, step 905 determines if the input code corresponding to the second case has an error, that is, if the output code corresponding to the second case meets a case 1 Z rule, the output code corresponding to the first case (i.e., case 1 OC) is assigned by a symbol Z indicating the demodulation error and doesn't care value. However, if the output code corresponding to the second case has no error, the output code corresponding to the second case, generated from step 903, directly serves as an output code corresponding to case 1. Assuming the same result is obtained, it should be noted that the order in which steps 901 through 905 is performed is not limited to that shown in FIG. 9.

Figure 10:
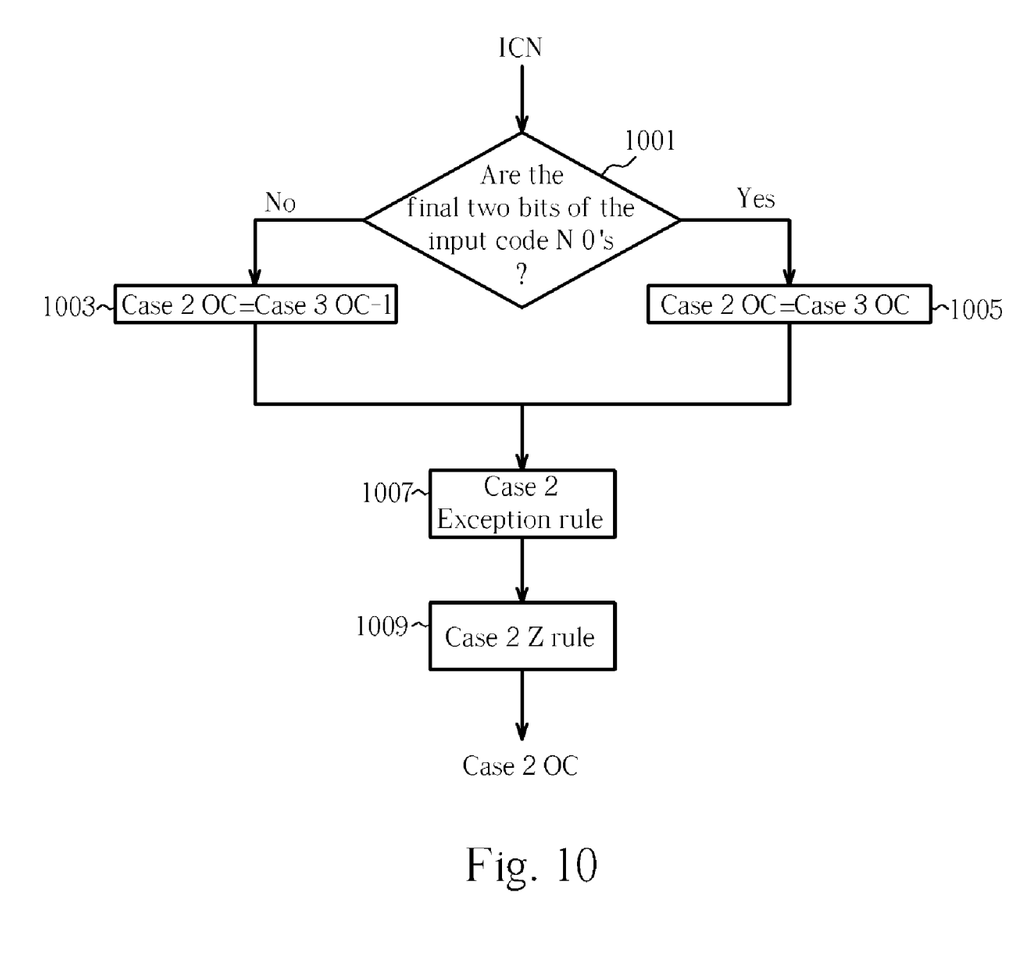
FIG. 10 is a flow chart illustrating the detailed operation of a case 2 modulation step shown in FIG. 9.

FIG. 10 is a flow chart illustrating the detailed operation of the case 2 modulation step shown in FIG. 9. As shown in FIG. 10, step 1001 determines if the final two bits of the input code N (i.e., ICN) from step 901 are 0's. If the final two bits are not 0's, go to step 1003, which determines the output code corresponding to the second case as the output code corresponding to the third case minus 1; otherwise, go to step 1005, which determines the output code corresponding to the second case as the output code corresponding to the third case. In addition, if the input code N meets a specific pattern, step 1007 directly demodulates the input code N into the output code corresponding to the second case by referencing a case 2 exception rule. In short, if the case 2 exception rule is met, the output of step 1003 or 1005 is discarded. Next, step 1009 determines if the input code N has an error, that is, if the input code N meets specific rules, the output code corresponding to the second case is assigned by a symbol Z indicating an error. In this case, the symbol indicating an error is Z. Utilizing steps 1001 through 1009, the input code N is demodulated to the output code corresponding to the second case. Assuming the same result is obtained, the order of steps 1001 through 1009 is not limited to that shown in FIG. 10.

The step 901 follows the rules shown below:

```
If IC =[------ ----00] then
    ICN= IC with a final bit replaced with 1
else
    ICN=IC
```

Step 905 follows the rules shown below, wherein the symbol Z means that the input code has an error:

```
IC [------ -----1]=> Case 1 OC =[Z]
IC [001010 101010]=>Case 1 OC=[Z]
IC [010101 010100]=>Case 1 OC=[Z]
```

Step 1007 follows the rules shown below: input is in binary format and the output is in hex format

```
IC =[000000 001001]=>Case2 OC=[48]
IC= [001000 000010]=>Case2 OC=[CA]
```

It should be noted that the input code and the output code comply with HD-DVD specification in this embodiment. That is, input code is a 12-bit code word, output code is an 8-bit data word, and the input code meets the aforementioned bit string rule. Also, the input code may be converted from raw data before the demodulation process starts.

Figure 11:
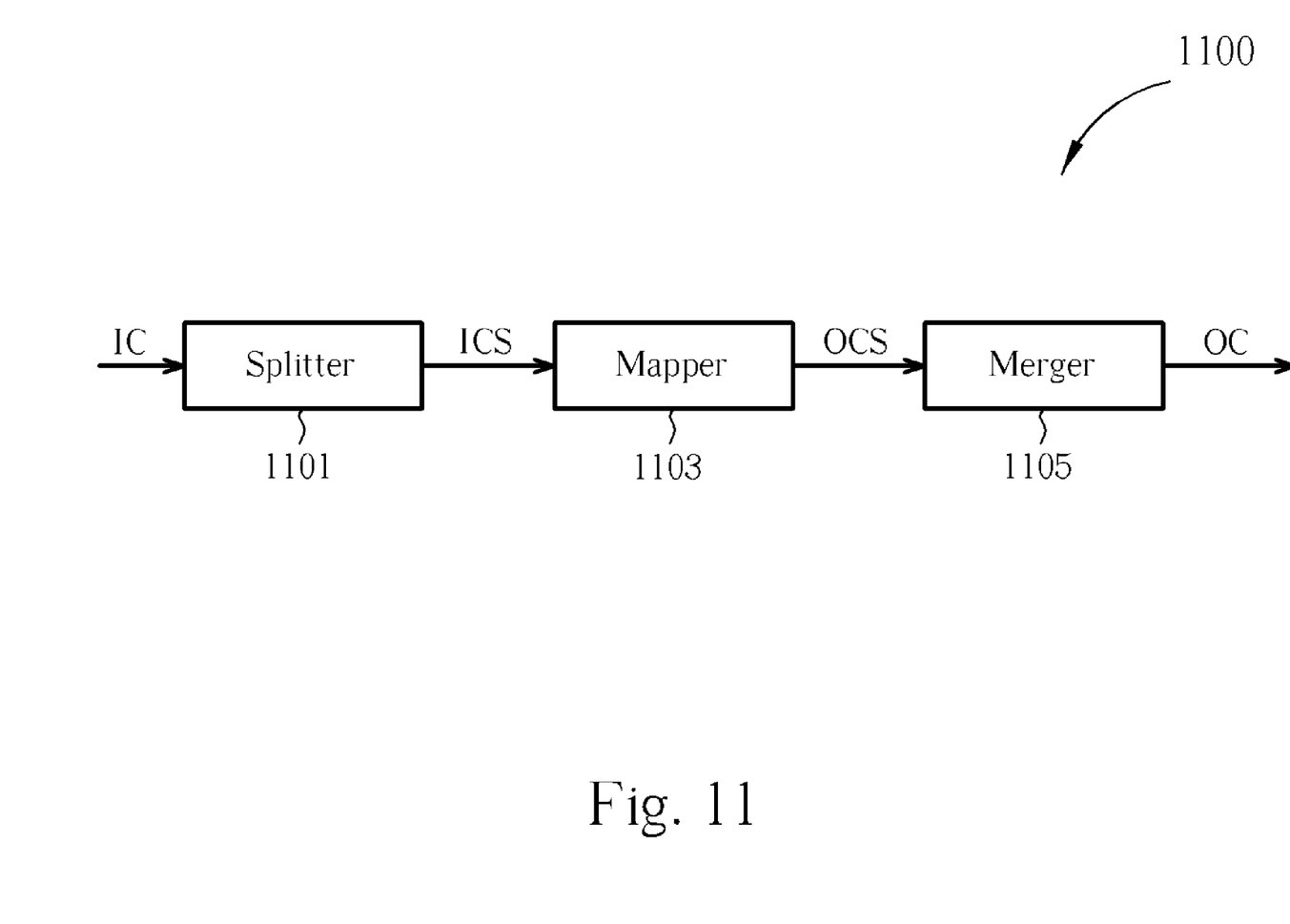
FIG. 11 is a block diagram illustrating a system for carrying out the method for modulation/demodulation shown in FIGS. 5 through 9.

FIG. 11 is a block diagram illustrating a converting system 1100 for implementing the method for modulation/demodulation shown in FIGS. 5 through 10. The converting system 1100 includes a splitter 1101, a mapper 1103, and a merger 1105. The splitter 1101 is used for determining a plurality of input code subsets (ICS) of the input code (IC).

Also, the splitter 1101 can further convert the input code (IC) to the input code N (ICN). The mapper 1103, which is coupled to the splitter, is used for converting the input code subsets into a plurality of output code subsets (OCS), respectively. The merger 1105, which is coupled to the mapper, is used for merging the output code subsets to generate the output code.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method for converting an input code into an output code, comprising:
   determining a plurality of input code subsets of the input code;
   converting the input code subsets into a plurality of output code subsets, respectively; and merging the output code subsets to generate the output code.

2. The method of claim 1, wherein the step of converting the input code subsets modulates the input code subsets into the output code subsets.

3. The method of claim 2, wherein the input code and the output code comply with the HD-DVD specification.

4. The method of claim 2, wherein the step of converting the input code subsets comprises:
   modulating the input code subset into an output code subset; and
   adjusting the output code subset when a special head rule is met.

5. The method of claim 2, wherein the step of converting the input code subsets comprises:
   converting one of the input code subsets into an updated input code subset when a tail rule conversion is executed; and
   modulating the original input code subset into an output code subset when the tail rule conversion is not executed, and modulating the updated subset into the output code subset when the tail rule conversion is executed.

6. The method of claim 2, further comprising:
   when the step of converting the input code subsets fails to generate the output code subsets, directly modulating the input code into the output code.

7. The method of claim 2, further comprising:
   converting a raw data into the input code.

8. The method of claim 2, further comprising:
   adding a control bit or a merging bit to the output code according to at least one of the input code subsets and the output code subsets, wherein the control bit is utilized for controlling a DC value, and the merging bit is utilized for controlling merging of two output codes.

9. The method of claim 2, wherein the step of converting the input code subsets references a current modulation state to generate the output code subsets,
   and the method further comprises:
   determining a next modulation state according to at least one of an output code subset and an input code subset.

10. The method of claim 9, wherein the value of the output code corresponding to a first state is derived from the value of the output code
    corresponding to a second state.

11. The method of claim 1, wherein the step of converting the input code subsets demodulates the input code subsets into the output code subsets.

12. The method of claim 11, wherein the input code complies with the HD-DVD specification.

13. The method of claim 11, further comprising:
    when the step of converting the input code subsets fails to generate the output code subsets, directly demodulating the input code into the output code.

14. The method of claim 11, further comprising:
    converting a raw data into the input code.

15. The method of claim 11, wherein the output code corresponding to the same input code includes a second case and a third case, the output code generated from the step of merging the output code subsets corresponds to the third case, and the output code corresponding to the second case is derived from the output code corresponding to the third case.

16. The method of claim 15, wherein if the final two bits of the input code are not 0's, the output code corresponding to the second case is derived from subtracting 1 from the output code corresponding to the third case.

17. The method of claim 16, wherein if the ending two bits of the input code are 0's, the output code corresponding to the second case is set by the output code corresponding to the third case.

18. The method of claim 15, wherein if the final 5 bits of the input code are 0's, the output code corresponding to the second case is a symbol indicating an error.

19. The method of claim 15, wherein the output code corresponding to the same input code further includes a first case, and the output code corresponding to the first case is derived from at least one of the output code corresponding to the second case or the output code corresponding to the third case.

20. The method of claim 19, wherein if the final two bits of the input code are 0's, a code N is set by the input code corresponding to a final bit replaced with 1, else the code N is set by the input code; and the output code corresponding to the second case is set according to the code N, where the output code corresponding to the first case is set by the output code corresponding to the second case.

21. The method of claim 20, wherein if the final two bits of the code N are not 0's, then the output code corresponding to the second case is derived from subtracting 1 from the output code corresponding to the third case.

22. The method of claim 20, wherein if the code N meets a specific pattern, directly demodulating the code N into the output code corresponding to the second case.

23. The method of claim 20, wherein if the final 5 bits of the code N are 0's, the output code corresponding to the second case is a symbol indicating an error.

24. A system for converting an input code into an output code, comprising:
 a splitter, for determining a plurality of input code subsets of the input code;
 a mapper, coupled to the splitter, for converting the input code subsets into a plurality of output code subsets, respectively; and
 a merger, coupled to the mapper, for merging the output code subsets to generate the output code.

25. The system of claim 24, wherein the mapper modulates the input code subsets into the output code subsets.

26. The system of claim 25, wherein the input code and the output code comply with the HD-DVD specification.

27. The system of claim 25, the mapper further adjusts the output code subset when a special head rule is met.

28. The system of claim 25, the mapper further converts the input code subset into an updated input code subset when a tail rule conversion is executed and modulates the original input code subset into an output code subset when the tail rule conversion is not executed, and modulates the updated subset into the output code subset when the tail rule conversion is executed.

29. The system of claim 25, further comprises an exception merger, when the mapper fails to generate the output code subsets, the exception merger directly modulates the input code into the output code.

30. The system of claim 25, further comprises a converter, for converting a raw data into the input code.

31. The system of claim 25, the mapper further adds a control bit or a merging bit to the output code according to at least one of the input code subsets and the output code subsets, wherein the control bit is utilized for controlling a DC value, and the merging bit is utilized for controlling merging of two output codes.

32. The system of claim 25, wherein the mapper references a current modulation state to generate the output code subsets, and the mapper further comprises: determining a next modulation state according to at least one of an output code subset and an input code subset.

33. The system of claim 32, wherein the mapper derives the value of the output code corresponding to a first state from the value of the output code corresponding to a second state.

34. The system of claim 24, wherein the mapper demodulates the input code subsets into the output code subsets.

35. The system of claim 34, wherein the input code and the output code comply with the HD-DVD specification.

36. The system of claim 34, further comprising an exception merger, and when the mapper fails to generate the output code subsets, the exception directly demodulates the input code into the output code.

37. The system of claim 34, further comprising a converter, for converting a raw data into the input code.

38. The system of claim 34, wherein the output code corresponding to the same input code includes a second case and a third case, the output code generated from the mapper corresponds to the third case, and the mapper derives the output code corresponding to the second case from the output code corresponding to the third case.

39. The system of claim 38, wherein if the final two bits of the input code are not 0's, the mapper derives the output code corresponding to the second case from subtracting 1 from the output code corresponding to the third case.

40. The system of claim 39, wherein if the ending two bits of the input code are 0's, the mapper sets the output code corresponding to the second case by the output code corresponding to the third case.

41. The system of claim 38, wherein if the final 5 bits of the input code are 0's, the mapper sets the output code corresponding to the second case by a symbol indicating an error.

42. The system of claim 38, wherein the output code corresponding to the same input code further includes a first case, and the mapper derives the output code corresponding to the first case from at least one of the output code corresponding to the second case or the output code corresponding to the third case.

43. The system of claim 42, wherein if the final two bits of the input code are 0's, the mapper sets a code N by the input code with a final bit replaced with 1, else the mapper sets the code N by the input code, and the output code with the second case is set by according to the code N, where the output code with the first case is set by the output code with the second case.

44. The system of claim 43, wherein if the final two bits of the code N are not 0's, then the mapper sets the output code corresponding to the second case by the output code corresponding to the third case subtracting 1.

45. The system of claim 43, wherein if the code N meets a specific pattern, the mapper directly demodulates the code N into the output code corresponding to the second case.

46. The system of claim 43, wherein if the final 5 bits of the code N are 0's, the mapper sets the output code corresponding to the second case a symbol indicating an error.

* * * * *